United States Patent
Reijonen

(10) Patent No.: US 11,310,898 B2
(45) Date of Patent: Apr. 19, 2022

(54) COMPACT HIGH-VOLTAGE POWER SUPPLY AND RADIATION APPARATUS SYSTEMS AND METHODS

(71) Applicant: Schlumberger Technology Corporation, Sugar Land, TX (US)

(72) Inventor: Jani Reijonen, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 16 days.

(21) Appl. No.: 16/722,769

(22) Filed: Dec. 20, 2019

(65) Prior Publication Data

US 2021/0195721 A1    Jun. 24, 2021

(51) Int. Cl.
| | |
|---|---|
| *H05G 1/10* | (2006.01) |
| *H01J 35/06* | (2006.01) |
| *H05G 1/34* | (2006.01) |
| *H01J 1/14* | (2006.01) |
| *H01J 35/14* | (2006.01) |
| *H01J 37/24* | (2006.01) |

(52) U.S. Cl.
CPC .............. *H05G 1/10* (2013.01); *H01J 1/14* (2013.01); *H01J 35/064* (2019.05); *H01J 35/065* (2013.01); *H01J 35/14* (2013.01); *H01J 37/241* (2013.01); *H05G 1/34* (2013.01)

(58) Field of Classification Search
CPC .......... H01J 1/15; H01J 35/147; H01J 35/065; H01J 35/13; H01J 37/147; H05G 1/10
See application file for complete search history.

(56) References Cited

U.S. PATENT DOCUMENTS

| 4,720,844 A * | 1/1988 | Bougle ............... H05G 1/10 363/61 |
| 6,426,507 B1 * | 7/2002 | Rangwalla ............ B05D 3/068 250/492.3 |
| 9,179,535 B2 * | 11/2015 | Perkins ................. G01V 5/10 |
| 9,520,263 B2 * | 12/2016 | Case .................... H01J 35/147 |
| 10,893,839 B2 * | 1/2021 | Fan ...................... A61B 6/032 |
| 2003/0147498 A1 | 8/2003 | Hadland et al. |

(Continued)

FOREIGN PATENT DOCUMENTS

| EP | 2389790 B1 | 12/2014 |
| JP | 2000048995 A | 2/2000 |
| JP | 2002231496 A | 8/2002 |

OTHER PUBLICATIONS

International Search Report and Written Opinion of PCT Patent Application No. PCT/US2020/063848 dated Apr. 1, 2021.

*Primary Examiner* — David P Porta
*Assistant Examiner* — Fani P Boosalis
(74) *Attorney, Agent, or Firm* — Trevor G. Grove

(57) ABSTRACT

A apparatus may include a power supply to receive a first voltage potential and output a second voltage potential that is greater than the first voltage potential and a cathode emitter to emit ions in response to application of the second voltage potential. The apparatus may also include a step down transformer to receive the second voltage potential and output a third voltage potential that is less than the second voltage potential. The apparatus may also include a heating element to, in response to application of the third voltage potential, heat the cathode emitter and lower a work function of the cathode emitter.

17 Claims, 10 Drawing Sheets

(56) References Cited

U.S. PATENT DOCUMENTS

| | | | |
|---|---|---|---|
| 2010/0032587 A1* | 2/2010 | Hosch | H01J 37/06 |
| | | | 250/492.3 |
| 2014/0270083 A1 | 9/2014 | Dinsmore | |
| 2018/0003854 A1* | 1/2018 | Simon | G01V 5/125 |
| 2018/0144902 A1* | 5/2018 | Lemaitre | H01J 35/147 |
| 2020/0321182 A1 | 10/2020 | Reijonen et al. | |

* cited by examiner

COMPACT HIGH-VOLTAGE POWER SUPPLY AND RADIATION APPARATUS SYSTEMS AND METHODS

BACKGROUND

This disclosure relates generally to systems and methods for a compact high-voltage power supply and radiation apparatus, for example, as used in downhole tools. Furthermore, although discussed herein in the context of downhole tools, the discussed techniques may be applicable in any suitable radiation apparatus.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as an admission of any kind.

Generally, an electrically operated radiation apparatus, such as an x-ray apparatus, a gamma ray apparatus, or a neutron apparatus, may generate radiation using electrical power to facilitate determining characteristics of the surrounding environment, such as a geological formation. Thus, radiation apparatus may be used in various contexts, such as a downhole tool or for material analysis. In some scenarios, a high-voltage power supply and/or a cathode heater power supply may be implemented to achieve the high energy radiation. For example, a charged particle beam of electrons or other ions may be emitted from a cathode and accelerated by electric fields, such as in a particle accelerator, into a target to generate radiation such as neutrons or x-rays. In some instances, such electronic radiation apparatus are used in downhole well-logging tools to take measurements of a geological formation. The radiation may exit the downhole tool and proceed into the geological formation, and measurements of the radiation that return to the downhole tool may provide an indication of where hydrocarbon resources may be located, as well as other characteristics of the geology of the formation. In some scenarios, the measurements of the radiation that returns to the downhole tool may depend on the amount of radiation that was initially emitted by the radiation apparatus. As such, providing a more consistent or predictable supply of radiation may allow for a more accurate and/or precise measurement.

Given the size limitations on downhole tools, the power supplies and radiation apparatus may be packaged in a relatively small housing. Further, as stated above, a radiation apparatus may use a cathode emitter to produce electrons in the form of an electron beam. However, in some scenarios, such as for a hot cathode, the cathode emitter may use a separate power supply (e.g., separate from the high-voltage power supply) along with a transformer to power the cathode heater, which may increase the diameter of the tool.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An electrically operated downhole tool, such as a nuclear radiation apparatus, may generate radiation (e.g., x-rays, gamma rays, neutrons, etc.) using electrical power to facilitate determining characteristics of its surrounding environment. To achieve the high energy radiation, a high-voltage power supply such as a voltage multiplier (e.g., a Cockcroft-Walton high-voltage ladder or other suitable voltage multiplier) may be implemented to bias a cathode emitter of a beam injector to create an ion beam. Additionally, in some embodiments, the high-voltage generated by the high-voltage power supply may be stepped down to also power a hot cathode heater.

Additionally or alternatively, the beam injector may also include an electrode to bias at least a portion of the electrons to remain on the cathode emitter and focus the emitted electrons into an electron beam. The beam injector may also include a resistor coupled between the cathode emitter and the electrode and configured to allow self-regulation of a voltage potential on the electrode based at least in part on a current of the electron beam. The self-regulation of the voltage potential may allow for more accurate and precise ion beam for either a hot cathode or a cold cathode.

In one embodiment, an apparatus may include a power supply to receive a first voltage potential and output a second voltage potential that is greater than the first voltage potential and a cathode emitter to emit ions in response to application of the second voltage potential. The apparatus may also include a step down transformer to receive the second voltage potential and output a third voltage potential that is less than the second voltage potential. The apparatus may also include a heating element to, in response to application of the third voltage potential, heat the cathode emitter and lower a work function of the cathode emitter.

In another embodiment, a method comprising may include receiving a power input at a first voltage potential and increasing, via a voltage multiplier, the first voltage potential to a second voltage potential. The method may also include decreasing, via a transformer, the second voltage potential to a third voltage potential. The method may also include providing the second voltage potential to a cathode emitter and providing the third voltage potential to a heating element of the cathode emitter.

The another embodiment, a downhole tool may include a radiation apparatus that has a cathode emitter to emit electrons and an electrode to bias at least a portion of the electrons to remain on the cathode emitter and focus the electron into an electron beam. The downhole tool may also include a resistor coupled between the cathode emitter and the electrode to allow self-regulation of a voltage potential on the electrode based at least in part on a current of the electron beam. The downhole tool may also include a high-voltage power supply comprising a voltage multiplier to supply power to the cathode emitter at a voltage potential.

Various refinements of the features noted above may be undertaken in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
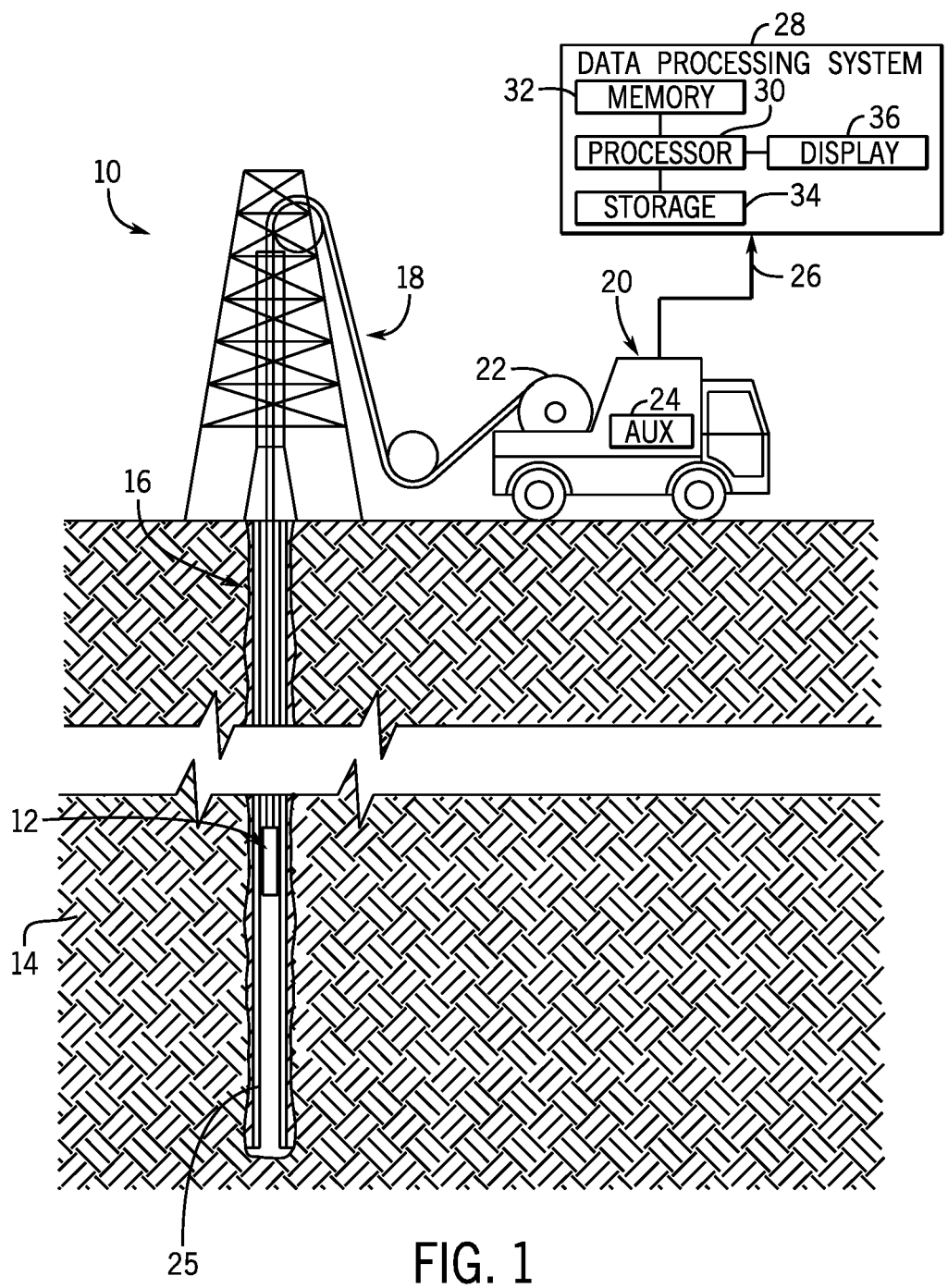
FIG. 1 is a schematic diagram of a well site system that may employ a beam injector in a downhole tool, in accordance with an embodiment.

One or more specific embodiments of the present disclosure will be described below. These described embodiments are examples of the presently disclosed techniques. Additionally, in an effort to provide a concise description of these embodiments, features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would still be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The exploration of what lies beneath the ground may be accomplished by a number of methods including surface and downhole techniques. The discovery and observation of resources using downhole techniques generally takes place down in the wellbore with downhole tools. These downhole tools may be a part of a tool-string that may be attached to a drill or other downhole device.

One particular type of downhole tool may include an electrically operated radiation apparatus for generating nuclear radiation (e.g., neutrons, gamma rays, x-rays, etc.) to facilitate determining characteristics (e.g., porosity, density and/or mineralogy) of the formation. As used herein, nuclear radiation shall include radiation of nuclear particles and/or photonic particles. Depending on the desired characteristics to be determined, various types of electrically operated radiation apparatus s may be used, such as x-ray apparatus s, gamma ray apparatus s, or neutron apparatus s. For example, in a downhole tool, a radiation apparatus may facilitate determining the porosity of surrounding formations, based at least in part on counts (e.g., number of neutrons or gamma-rays) of radiation, density of surrounding formation, based on photon counts and/or determining the mineralogy of surrounding formations, based at least in part on a spectrum of radiation measured by a detector (e.g., scintillator).

Nevertheless, the different types of electrically operated radiation apparatus s may use high-voltage power supplies to facilitate the generation of the nuclear radiation. For example, high-voltages may be used to produce electric fields to accelerate a particle (e.g., electron, ion, or other charged particle) toward a target. When the particle strikes atoms of the target, nuclear radiation may be generated and output from the downhole tool. The radiation may then interact with atoms in the surrounding environment (e.g., the formation) and a response detected.

Charged particles (e.g., electrons or other ions) may be generated from a variety of sources for a variety of uses. In particular, it may be desired to generate a focused beam of charged particles such that the charged particles are emitted in generally the same direction. For example, a beam injector may emit the charged particle beam for acceleration via a particle accelerator for use in a radiation generation. In the radiation apparatus, a charged particle beam of electrons or other ions may be accelerated (e.g., via electric fields) into a target to generate radiation such as neutrons or x-rays. In some instances, such electronic radiation apparatus s are used in downhole well-logging tools to take measurements within a wellbore of a geological formation. The radiation may exit the downhole tool and proceed into the geological formation. The response of the geological formation to the emitted radiation may be used by the downhole tool to assess properties of the geological formation, and may indicate the presence or absence of hydrocarbons or other elements at particular locations in the geological formation that surrounds the wellbore. The downhole tool may also use the radiation to identify other properties of the geological formation, such as porosity, lithology, density, and so forth. As should be appreciated, although described herein as applying to radiation apparatus s for downhole tools, embodiments of the present disclosure may also apply to any suitable beam injector, high-voltage power supply, and/or radiation apparatus.

In one embodiment, the beam injector may generate a charged particle beam and utilize a Wehnelt electrode to stabilize and/or focus the charged particle beam. Further, in some embodiments, the beam current (e.g., the amount of charged particles being emitted) and beam optics (e.g., the direction, focusing, and/or collimation of the charged particle beam) may be controlled such that current surges may be minimized and/or the charged particle beam maintains focus with minimal charged particles straying from the desired beam path. Moreover, the Wehnelt potential may be self-regulated based on the beam current to maintain the desired beam current and the desired beam optics. The self-regulated beam injector may utilize a cold cathode or a hot cathode.

In the case of the hot cathode, a power source may provide electric current to heat the cathode such that energy may be imparted to electrons on the surface of the cathode emitter to overcome the electron work function of the cathode material and assist in the generation of electrons. In some embodiments, the high-voltage power supply may include a step down transformer to power the cathode heater instead of having a dedicated power supply and isolation transformer, which may take up additional space within the downhole tool.

With the foregoing in mind, FIG. 1 illustrates a well-logging system 10 that may employ the systems and methods of this disclosure. The well-logging system 10 may be used to convey a downhole tool 12 through a geological formation 14 via a wellbore 16. In the example of FIG. 1, the downhole tool 12 is conveyed on a cable 18 via a logging winch system (e.g., vehicle) 20. Although the logging winch system 20 is schematically shown in FIG. 1 as a mobile logging winch system carried by a truck, the logging winch system 20 may be substantially fixed (e.g., a long-term installation that is substantially permanent or modular). Any suitable cable 18 for well logging may be used. The cable 18 may be spooled and unspooled on a drum 22 and an auxiliary power source 24 may provide energy to the logging winch system 20 and/or the downhole tool 12. Furthermore, the downhole tool 12 may be used in any suitable wellbore 16, such as a wellbore 16 with or without a casing 25.

Moreover, while the downhole tool 12 is described as a wireline downhole tool, it should be appreciated that any suitable conveyance may be used. For example, the downhole tool 12 may instead be conveyed as a logging-while-drilling (LWD) tool as part of a bottom-hole assembly (BHA) of a drill string, conveyed on a slickline or via coiled tubing, and so forth. For the purposes of this disclosure, the downhole tool 12 may be any suitable downhole tool that uses a beam injector and/or particle accelerator, such as a radiation apparatus (e.g., a neutron apparatus, x-ray apparatus, etc.).

The downhole tool 12 may receive energy from an electrical energy device or an electrical energy storage device, such as the auxiliary power source 24 or another electrical energy source to power the tool. Additionally, in some embodiments the downhole tool 12 may include a power source within the downhole tool 12, such as a battery system or high voltage power supply to provide sufficient electrical energy to activate the radiation apparatus and/or record the response of the geological formation to the emitted radiation.

Control signals 26 may be transmitted from a data processing system 28 to the downhole tool 12, and data signals 26 related to radiation measurements may be returned to the data processing system 28 from the downhole tool 12. The data processing system 28 may process the radiation measurements to identify certain properties of the wellbore 16 (e.g., porosity, permeability, relative proportions of water and hydrocarbons, and so forth) that may be otherwise indiscernible by a human operator. The data processing system 28 may be any suitable electronic data processing system. For example, the data processing system 28 may include a processor 30, which may execute instructions stored in memory 32 and/or storage 34. As such, the memory 32 and/or the storage 34 of the data processing system 28 may be any suitable article of manufacture that can store the instructions. The memory 32 and/or the storage 34 may be read-only memory (ROM), random-access memory (RAM), flash memory, an optical storage medium, or a hard disk drive, to name a few examples. A display 36, which may be any suitable electronic display, may display images generated by the processor 30. The data processing system 28 may be a local component of the logging winch system 20 (e.g., within the downhole tool 12), a remote device that analyzes data from other logging winch systems 20, a device located proximate to the drilling operation, or any combination thereof. In some embodiments, the data processing system 28 may be a mobile computing device (e.g., tablet, smart phone, or laptop) or a server remote from the logging winch system 20.

Figure 2:
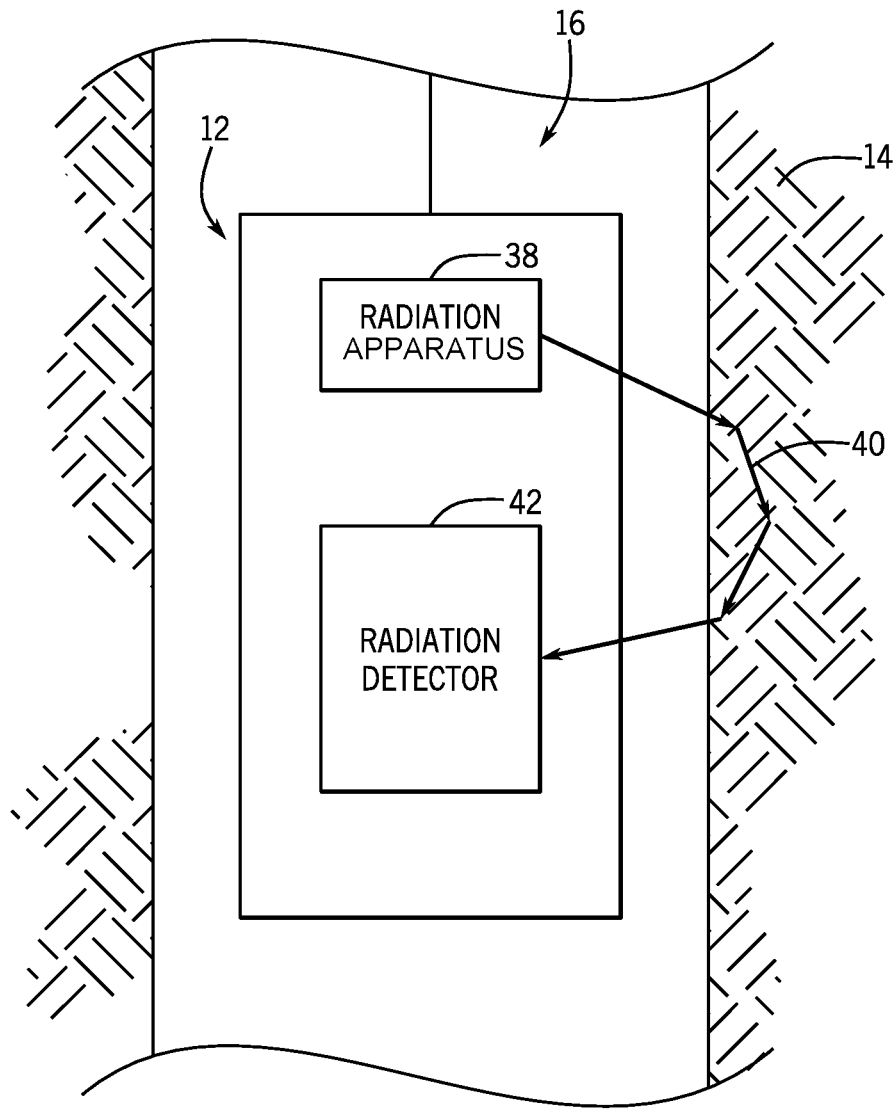
FIG. 2 is a block diagram of the downhole tool that may employ the beam injector in a radiation apparatus, in accordance with an embodiment.

One example of the downhole tool 12 is shown in FIG. 2. The downhole tool 12 may include a radiation apparatus 38 to emit radiation 40 (e.g., neutrons, x-rays, etc.) into the geological formation 14. As should be appreciated, the radiation apparatus 38 may be any suitable apparatus of nuclear radiation. For example, the radiation apparatus 38 may be an x-ray apparatus, a neutron apparatus, a pulsed neutron apparatus, or apparatus of other desired nuclear radiation. The radiation apparatus 38 emits radiation 40 out of the downhole tool 12 and into the geological formation 14, where it may scatter or collide with atoms of the geological formation 14 to generate secondary radiation (e.g., gamma rays) that also may scatter. Some of the radiation 40 or secondary radiation that results from interactions with the radiation 40 may return to the downhole tool 12, and be detected by a radiation detector 42. In general, the radiation detector 42 may detect counts and/or energy levels of the radiation 40 and/or secondary radiation and generate an electrical signal indicative of a count rate of the detected radiation or a spectrum of detected radiation that may provide an indication of characteristics of the wellbore 16 or the geological formation 14.

Figure 3:
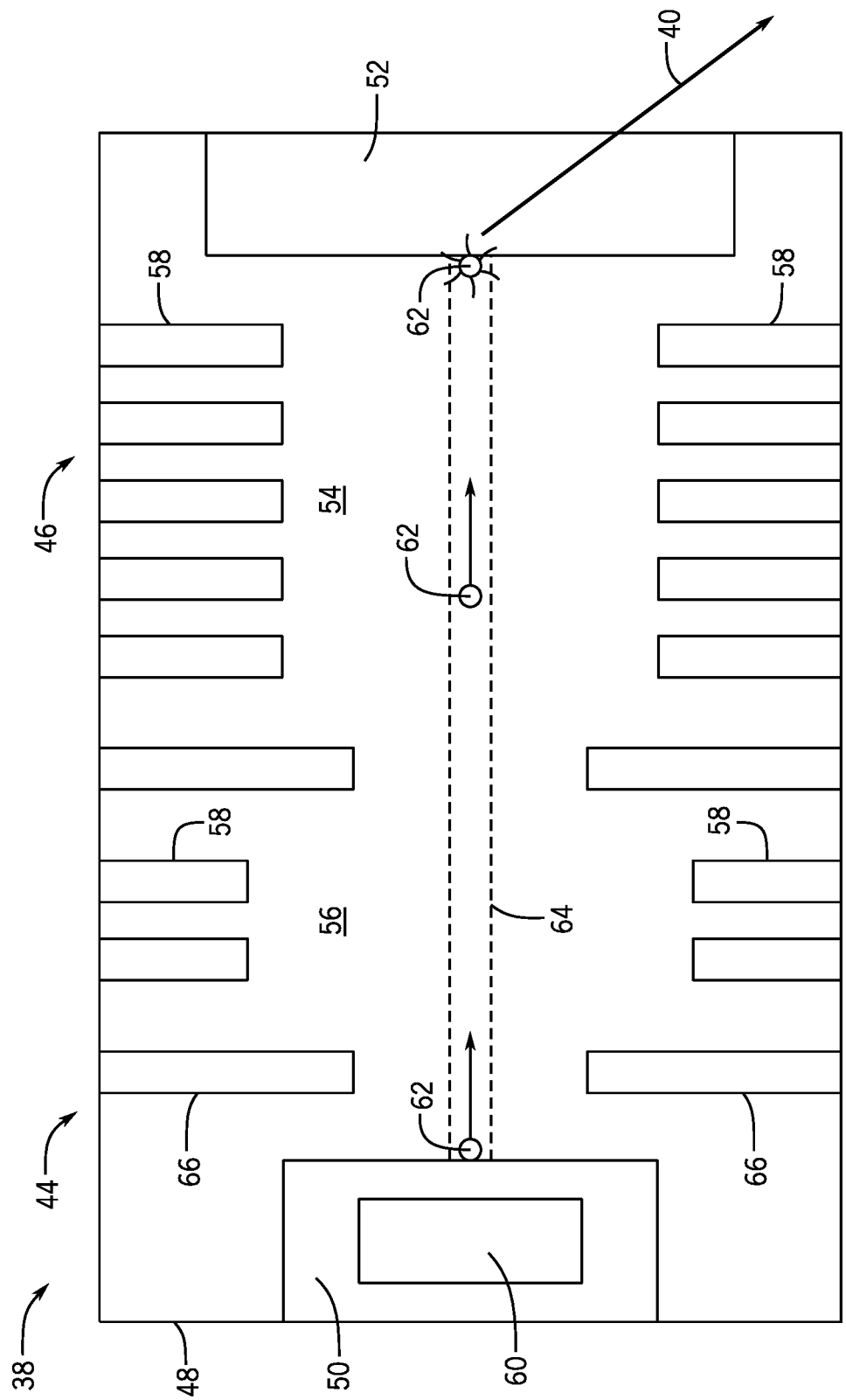
FIG. 3 is a schematic cross-section of the radiation apparatus including the beam injector and a particle accelerator, in accordance with an embodiment.

FIG. 3 is a schematic cross-section of an example radiation apparatus 38 including a beam injector 44 and a particle accelerator 46 disposed with a generally cylindrical housing 48. The housing 48 may contain a cathode emitter 50, a target 52, an acceleration chamber 54 and/or a focusing chamber 56. In some embodiments, the interior of the housing 48 may be coated with an insulating material, such as $Al_2O_3$, which has a high secondary electron emission coefficient. The insulating material may assist in electrically separating electrodes 58 of the acceleration chamber 54 and/or the focusing chamber 56. As discussed herein, it may be desired to maintain focused beam optics to limit the likelihood of the charged particles hitting the electrodes 58 or the insulating material, which may create short-circuit paths between the electrodes 58 if the charged particles (e.g., electrons) sputter against the walls of the housing 48.

In some embodiments, a heating element 60 may be disposed proximate the cathode emitter 50 to heat the cathode emitter 50 and provide the charged particles enough thermal energy to overcome the work function associated with emitting a charged particle. In one embodiment, the cathode emitter 50 may be formed of or include an emissive layer of a thermionic emission material such as yttrium oxide, lanthanum hexaboride, or any suitable material that readily emits charged particles, such as electrons 62, when heated. Furthermore, the cathode emitter 50 may also include a protective layer with a relatively high work function compared to that of the thermionic emission material. In some embodiments, the protective layer may coat the cathode emitter in areas where emission is not desired. Furthermore, the cathode emitter 50, including the thermionic emission material and/or the protective layer, may be shaped such that emitted electrons 62 are generally emitted in a singular direction to assist in focusing of the electron beam 64. In operation, the cathode emitter 50 of the beam injector 44 may produce a focused and stable electron beam 64 that strikes the target 52 to produce radiation 40. As should be appreciated, the target 52 may be of any suitable material, for example titanium or tungsten, to produce the desired form of radiation in response to the incoming electron beam 64. Although discussed herein as pertaining to electrons 62 having a negative charge and forming an electron beam 64, it should be appreciated that the emitted charged particle beam may be of any desired charged particle, and, consequently, the relative potentials (e.g., voltages) discussed herein may also be reversed, for example, if the desired charged particle included a positive charge.

In some embodiments, the cathode emitter 50 may be biased with a relatively negative potential (e.g., voltage). In contrast, the target 52 may have a positive potential relative to the cathode emitter 50. As such, the potentials of the cathode emitter 50 and/or the target 52 may form an electric field in which electrons 62 may accelerate toward the target 52. Additionally or alternatively, the electrodes 58 of the particle accelerator 46 may generate electric fields in which the electrons 62 of the electron beam 64 may accelerate toward the target 52. As such, the electron beam 64 may accelerate from the low and/or negative voltage potential of the cathode emitter 50 toward the higher and/or positive voltage potential of the target 52. The accelerated electrons 62 of the electron beam 64 may then impact the target 52, and cause the target 52 to give off radiation 40. As should be appreciated, as used herein, electric fields may also generally encompass magnetic and/or electromagnetic fields depending on reference frame.

In some embodiments, the beam injector 44 may also include a focusing chamber 56. The electrodes 58 within the focusing chamber 56 may assist in improving beam optics by generating electric fields to focus the electron beam 64 like an optical lens. As should be appreciated, the focusing chamber 56 and the acceleration chamber 54 may or may not have a discrete separation. Furthermore, the electrodes 58 of the acceleration chamber 54 and the focusing chamber 56 may be interlaced and/or serve both purposes.

The beam injector 44 may also include a Wehnelt electrode 66 maintained at a relatively negative potential relative to the cathode emitter 50. While the potentials of the target 52, cathode emitter 50, and/or particle accelerator 46 may motivate the electrons 62 to depart the cathode emitter 50 and accelerate towards the target 52, the Wehnelt electrode 66 may bias the electrons 62 to remain on the cathode emitter 50 and/or assist in focusing of the electron beam 64 by forcing the emitted electrons 62 towards the center of the beam injector 44. The negative bias of the Wehnelt electrode 66 may suppress the emission of electrons 62 such that the majority of electron emissions are at the center of the cathode emitter 50 relative to the Wehnelt electrode 66, thus, improving focus of the electron beam 64. In one embodiment, the Wehnelt electrode 66 may have a self-regulated potential based, at least in part, on the beam current of the electron beam 64. For example, as the beam current is increased, the negative potential of the Wehnelt electrode 66 may become more negatively biased, thus, confining and/or stabilizing the electron beam 64 and improving beam optics.

Figure 4:
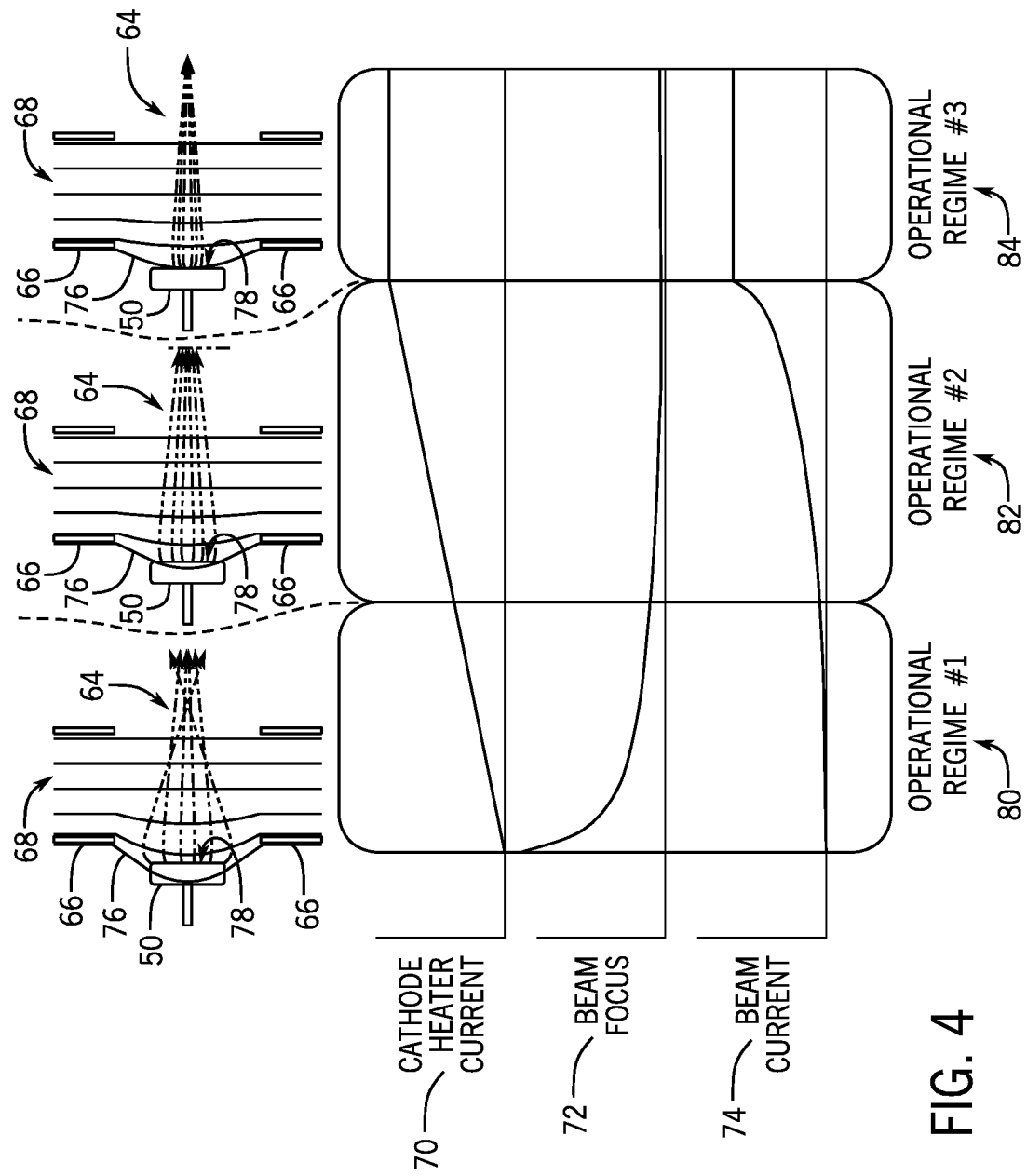
FIG. 4 is a schematic diagram of three operational regimes of the beam injector with associated potential lines as well as a cathode heater current, beam focus, and beam current at each of the operational regimes, in accordance with an embodiment.

To help illustrate, FIG. 4 is a schematic diagram of three operational regimes of the beam injector 44 with associated potential lines 68 as well as a cathode heater current 70, beam focus 72, and beam current 74 at each of the operational regimes. The potential lines 68 may be, in general, indicative of the summed electric fields as influenced by, for example, the potential of the cathode emitter 50, the potential of the target 52, the potential of the Wehnelt electrode 66, and/or the potentials of the electrodes 58 within the focusing chamber 56 and/or the acceleration chamber. Additionally, the "net zero" potential line 76 of the potential lines 68 is graphically illustrated for each of the three operational regimes to show the area of the surface 78 of cathode emitter 50 that is in an emissive state (e.g., likely to emit electrons 62), based on the surrounding electric fields.

For example, in the first operational regime 80, the magnitude of the negative potential on the Wehnelt electrode 66 is relatively low, and the potential lines 68 extend beyond the surface 78 of the cathode emitter 50, such that a wide area of the surface 78 is in the emissive state and likely to emit electrons 62. In other words, the "net zero" potential produced by the potential of the Wehnelt electrode 66 is behind the surface 78 of the cathode emitter 50. As such, electrons 62 on the surface 78 of the cathode emitter 50 with sufficient energy levels (e.g., relative to the work function of the cathode emitter 50) may be emitted. Since a wide area of the surface 78 is located in a positive electric field (e.g., in front of the net zero potential line 76) electrons 62 may be emitted from the wide area of the surface 78, which may lead to a wide electron beam 64 having relatively poor beam focus 72.

As the cathode heater current 70 is increased, the number of electrons 62 with enough thermal energy to overcome the work function of the cathode emitter 50 may also increase. As such, more electrons 62 may be emitted, thus, increasing the beam current 74. In one embodiment, the negative potential of the Wehnelt electrode 66 may be directly or indirectly related to (e.g., proportional to) the beam current 74. As such, as the cathode heater current 70 is increased, the magnitude of the negative potential of the Wehnelt electrode 66 (e.g., the Wehnelt potential) may also increase due to the increased beam current 74. Further, the increase in the magnitude of the Wehnelt potential may shift the net zero potential line 76 towards the surface 78 of the cathode emitter 50 and decrease the area of the surface 78 in the emissive state, as in the second operational regime 82. By moving the net zero potential line 76, such that a smaller area of the surface 78 is in the emissive state, the beam focus 72 may be improved. As should be appreciated, if the net zero potential line 76 were to continue moving off of the surface 78 of the cathode emitter 50 the Wehnelt potential may "pinch" off the electron beam 64, and the beam current 74 may be effectively zero.

In one embodiment, the Wehnelt electrode 66 may self-regulate the Wehnelt potential, based on the beam current 74, to obtain and maintain a saturated beam current 74 with respect to the cathode heater current 70, as in the third operational regime 84. The third operational regime 84 may occur when the relation between beam current 74 and the Wehnelt potential on the Wehnelt electrode 66 reaches saturation such that a further increase in the cathode heater current 70 may no longer affect an increase in beam current 74. For example, due to the self-regulation of the Wehnelt potential, a further increase in beam current 74 may result in an increased Wehnelt potential, which, in turn, would further move the net zero potential line 76 away from the surface 78 of the cathode emitter 50 and begin to pinch the electron beam 64, thus, decreasing the beam current 74. As such, the third operational regime 84 may define an equilibrium state for a given state of the cathode emitter potential, the Wehnelt potential (e.g., as driven by the emitted current), target potential, and potentials of the electrodes 58 within the focusing chamber 56 and/or the acceleration chamber 54.

Figure 5:
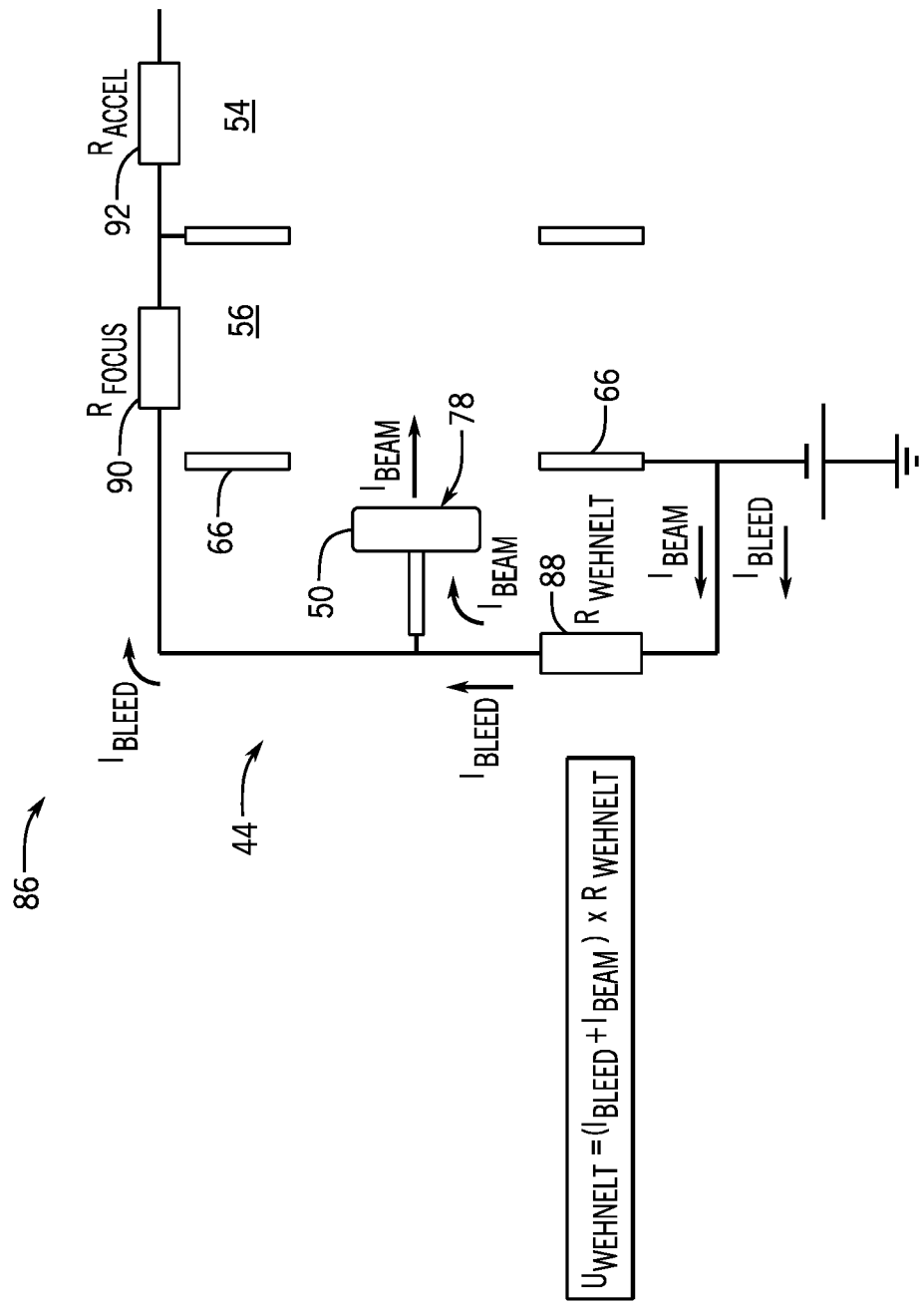
FIG. 5 is a schematic circuit diagram of the beam injector that self-regulates a potential on an electrode, in accordance with an embodiment.

FIG. 5 is a schematic circuit diagram 86 of one embodiment of the beam injector 44 that self-regulates the Wehnelt potential, $U_{Wehnelt}$, on the Wehnelt electrode 66. In one embodiment, a Wehnelt resistor 88 may be implemented between the cathode emitter 50 and the Wehnelt electrode 66. As such, the magnitude of the Wehnelt potential, relative to the cathode emitter potential, may be given by the total current, $I_{Total}$, through the Wehnelt resistor 88 multiplied by the resistance of the Wehnelt resistor 88, $R_{Wehnelt}$, as shown in EQ. 1, which is indicative of Ohm's Law.

$$U_{Wehnelt} = I_{Total} * R_{Wehnelt} \qquad \text{EQ. 1}$$

In general, the electrodes 58 of the focusing chamber 56 and/or the acceleration chamber 54 may be separated by one or more resistors in series or parallel to maintain the desired potentials of each electrode 58. As such, the portion of the circuit diagram 86 through the focusing chamber 56 and/or the acceleration chamber 54 may be generalized by a focusing resistor 90 and an acceleration resistor 92. Further, the total current, $I_{Total}$, may be a summation of the current through the focusing resistor 90 and/or the acceleration resistor, $I_{Bleed}$, as well as the beam current 74, $I_{Beam}$. As such, the Wehnelt potential may be given by, at least in a first order approximation, $$U_{Wehnelt} = (I_{Bleed} + I_{Beam}) * R_{Wehnelt}. \qquad \text{EQ. 2}$$

Accordingly, the Wehnelt potential, $U_{Wehnelt}$, may be self-regulated based, at least in part, on the beam current 74, $I_{Beam}$. As should be appreciated, the circuit diagram 86 is a simplified illustration, and further electrical components such as electrodes, capacitors, inductors, diodes, or resistors may also be included depending on implementation.

Additionally or alternatively, in some embodiments, the negative potential of the Wehnelt electrode 66 may be regulated by a variable power supply and/or Zener diodes. However, the use of a variable power supply to directly control the Wehnelt potential may entail active monitoring/adjustment, for example, by an additional power supply which may take up valuable real-estate or be impractical within the downhole tool 12 depending on implementation. Furthermore, the use of a Zener diode may result in a fixed maximum potential of the Wehnelt electrode 66 and/or limit the operational range of the beam current 74 while maintaining a focused electron beam 64 or limit the beam focus 72 at increased beam currents 74. The use of the Wehnelt resistor 88 between the Wehnelt electrode 66 and the cathode emitter 50 may allow for a self-regulated Wehnelt potential within the beam injector 44 that also maintains a desired amount of beam focus 72 throughout a range of beam currents 74.

Figure 6:
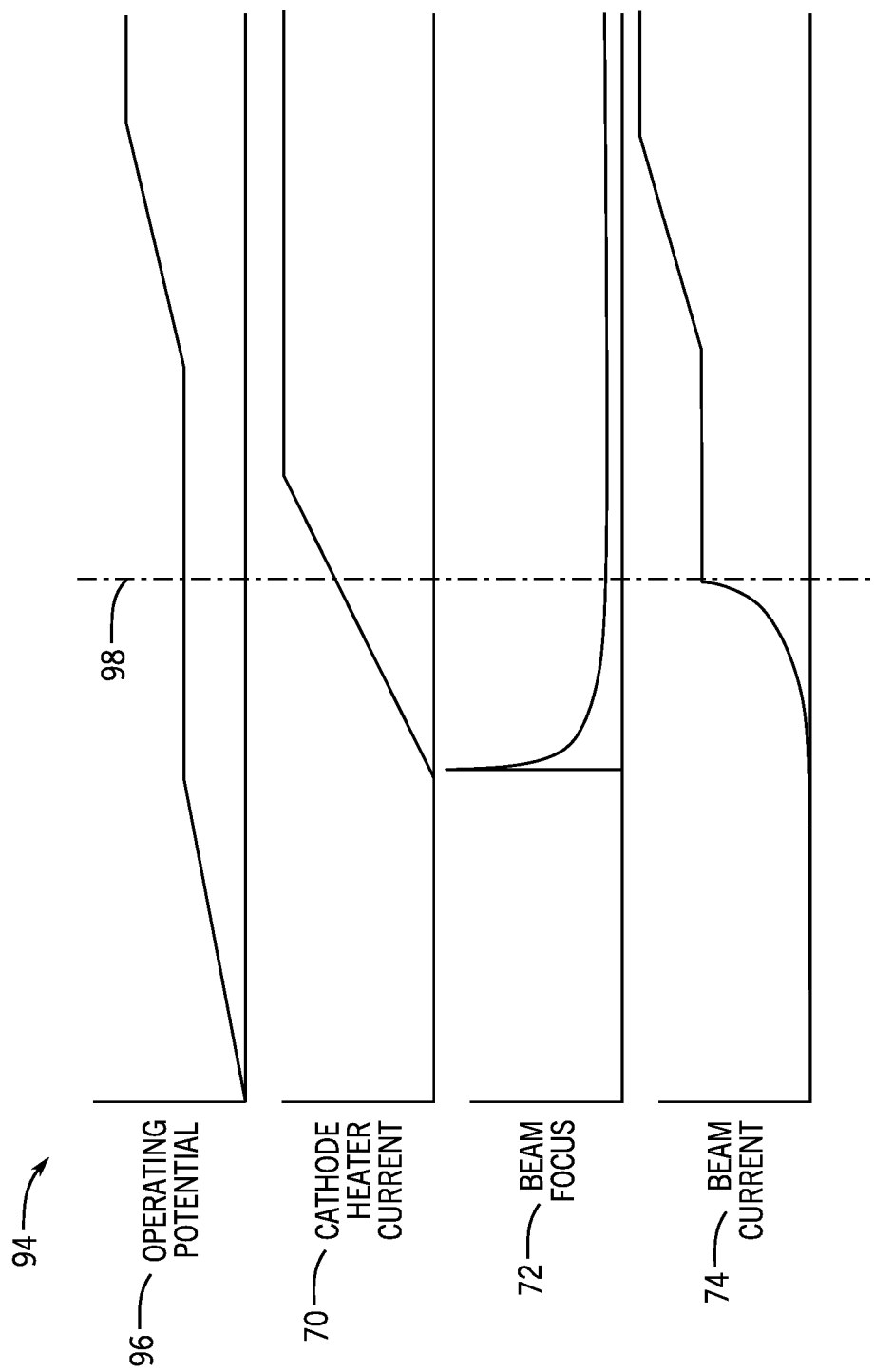
FIG. 6 is a graph of the beam current and beam focus in relation to the cathode heater current and the accelerator potential, in accordance with an embodiment.

In further illustration, FIG. 6 is a graph 94 of the beam current 74 and beam focus 72 in relation to the cathode heater current 70 and the operating potential 96. As stated above, as the cathode heater current 70 increases, the beam current 74 may also increase causing the Wehnelt potential to also increase, thus, improving the beam focus 72. After saturation 98, although the cathode heater current 70 may be increased, the beam current 74 and beam focus 72 may remain approximately constant. Additionally, in some embodiments, the operating potential 96 (e.g., the potential of the cathode emitter 50, the potential of the target 52, and/or potentials within the particle accelerator 46) may be increased to alter the potential lines 68 and motivate the net zero potential line 76 into the cathode emitter 50 to increase the beam current 74. Accordingly, the Wehnelt potential of the Wehnelt electrode 66 may be automatically regulated to maintain beam focus 72. As such, the self-regulated beam injector 44 may maintain beam focus 72 at various beam currents 74, depending, for example, on the value of the Wehnelt resistor (R Wehnelt). Additionally, spikes and/or surges in beam current 74 may be minimized due to the immediate change in Wehnelt potential as well as the beam current's negligible response to additional cathode heater current 70 after saturation 98.

The desired value for the Wehnelt resistor 88 of the beam injector 44 may be determined based on the desired beam focus 72 and desired beam current 74 at a desired range of operating potential 96. For example, at a particular operating potential 96, a smaller Wehnelt resistor 88 value may correspond to a wider electron beam 64 and/or a higher beam current 74. Likewise, at the same operating potential 96, a larger Wehnelt resistor 88 value may correspond to a narrower electron beam 64 and/or a smaller beam current 74. Additionally, in some embodiments, the Wehnelt resistor 88 may allow for increased efficiency (e.g., decreased complexity and time consumption) during calibration of the beam injector 44 and/or the radiation apparatus 38 by reducing the calibration to the adjustment of the Wehnelt resistor 88.

Figure 7:
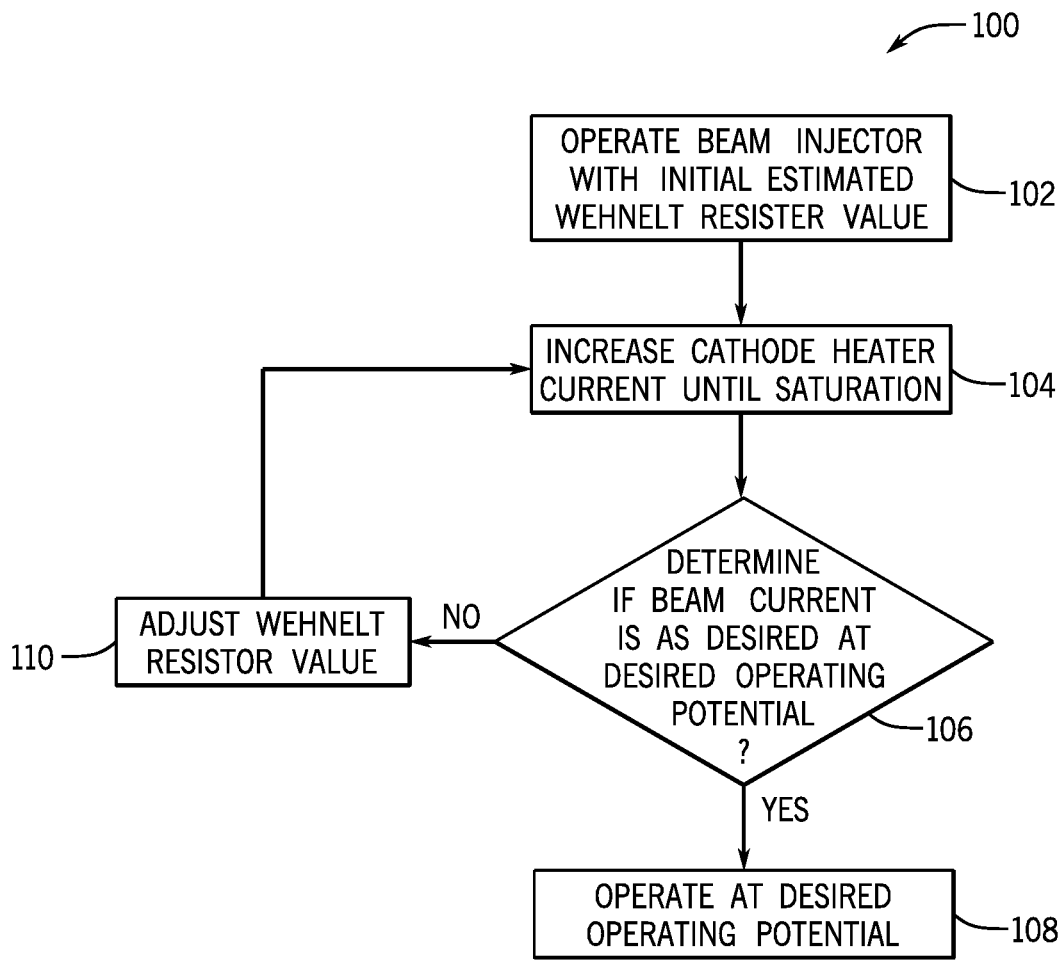
FIG. 7 is a flowchart of an example process for calibrating and operating the beam injector, in accordance with an embodiment.

FIG. 7 is a flowchart 100 of an example process for calibrating and operating the beam injector 44. The beam injector 44 may be operated with an initial estimated Wehnelt resistor 88 value corresponding to the desired operating potential 96, beam focus 72, and/or beam current 74 (process block 102). The cathode heater current 70 may then be increased until saturation 98 is achieved (process block 104). The beam current 74 may be analyzed to determine if the desired beam current 74 is achieved at the desired operating potential 96 (decision block 106). If the desired beam current 74 is achieved, the beam injector 44 may be operated at the desired operating potential 96 (process block 108). If the desired beam current 74 is not achieved, the Wehnelt resistor 88 value may be adjusted (process block 110). For example, if the beam current 74 is determined to be less than desired, the Wehnelt resistor 88 value may be reduced to reduce the magnitude of the Wehnelt potential. Moreover, if the beam current 74 is determined to be greater than desired, the Wehnelt resistor 88 value may be increased. After adjustment the cathode heater current 70 may be increased until saturation 98 (process block 104) and the beam current 74 may be determined again (process block 106). As should be appreciated, although the above referenced flowchart 98 is shown in a given order, in certain embodiments, the depicted decision and process blocks may be reordered, altered, deleted, and/or occur simultaneously. Additionally, the referenced flowchart 100 is given as an illustrative tool, and further decision and/or process blocks may be added depending on implementation.

Figure 8:
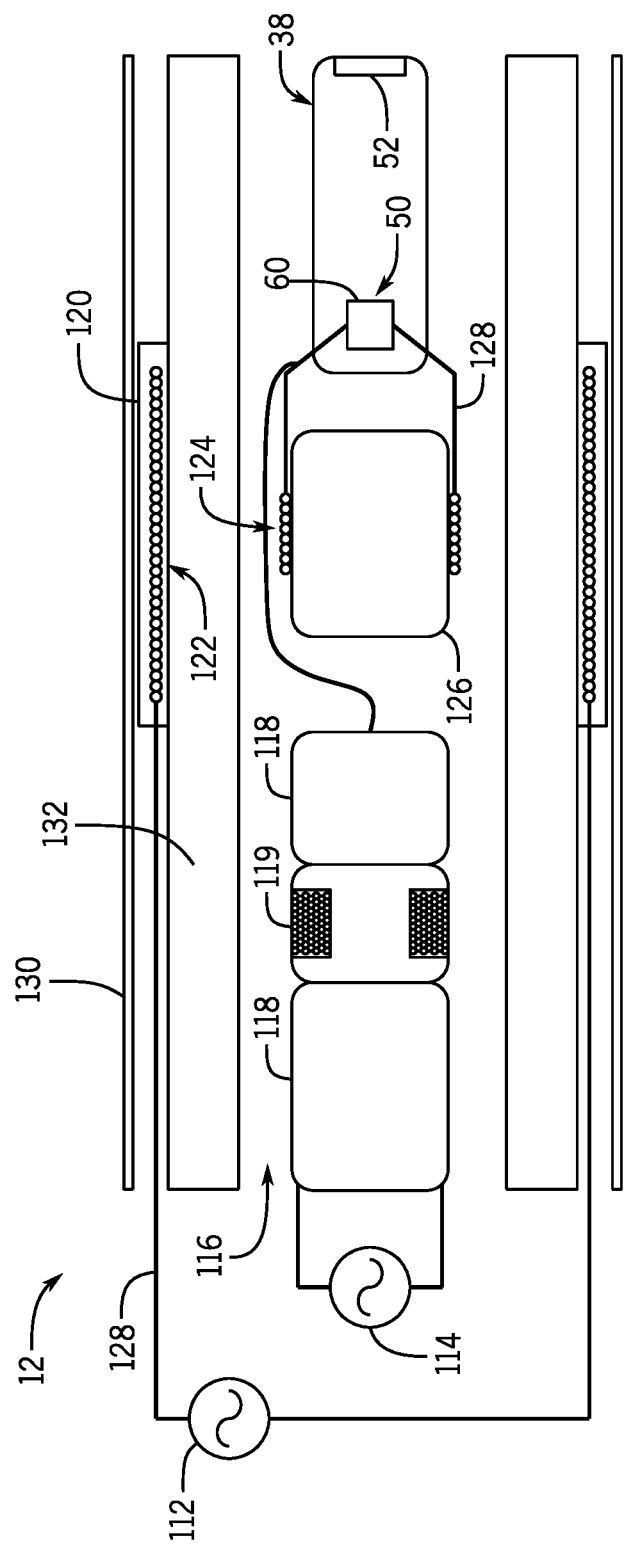
FIG. 8 is a schematic diagram of a downhole tool, in accordance with an embodiment.

As discussed above, in some embodiments, the beam injector 44 may include a cathode emitter 50, which may be heated to emit electrons 62 or other ions. Heating of the cathode emitter 50 may be accomplished by applying a voltage to the heating element 60. In some embodiments, the heating element 60 may be powered via a cathode driver 112, and the high-voltage applied to the cathode emitter 50 may be supplied via a high-voltage driver 114 augmented by a voltage multiplier 116, for example as depicted in FIG. 8. The voltage multiplier 116 may include one or more ladder sections 118 and a boosting coil 119. The boosting coil 119 may cause resonance within the ladder sections 118 to increase the voltage level output and efficiency of the voltage multiplier 116. Additionally, the cathode driver 112 may utilize a cathode isolation transformer 120 utilizing a set of primary coils 122 and secondary coils 124 around a magnetic core 126. The cathode isolation transformer 120 may facilitate power to the heating element 60 without routing the cathode power lines 128 in close proximity to the voltage multiplier 116, which may produce strong electric fields that could lead to electrical events such as arcing, tracking, field emission, and/or corona effects.

Figure 9:
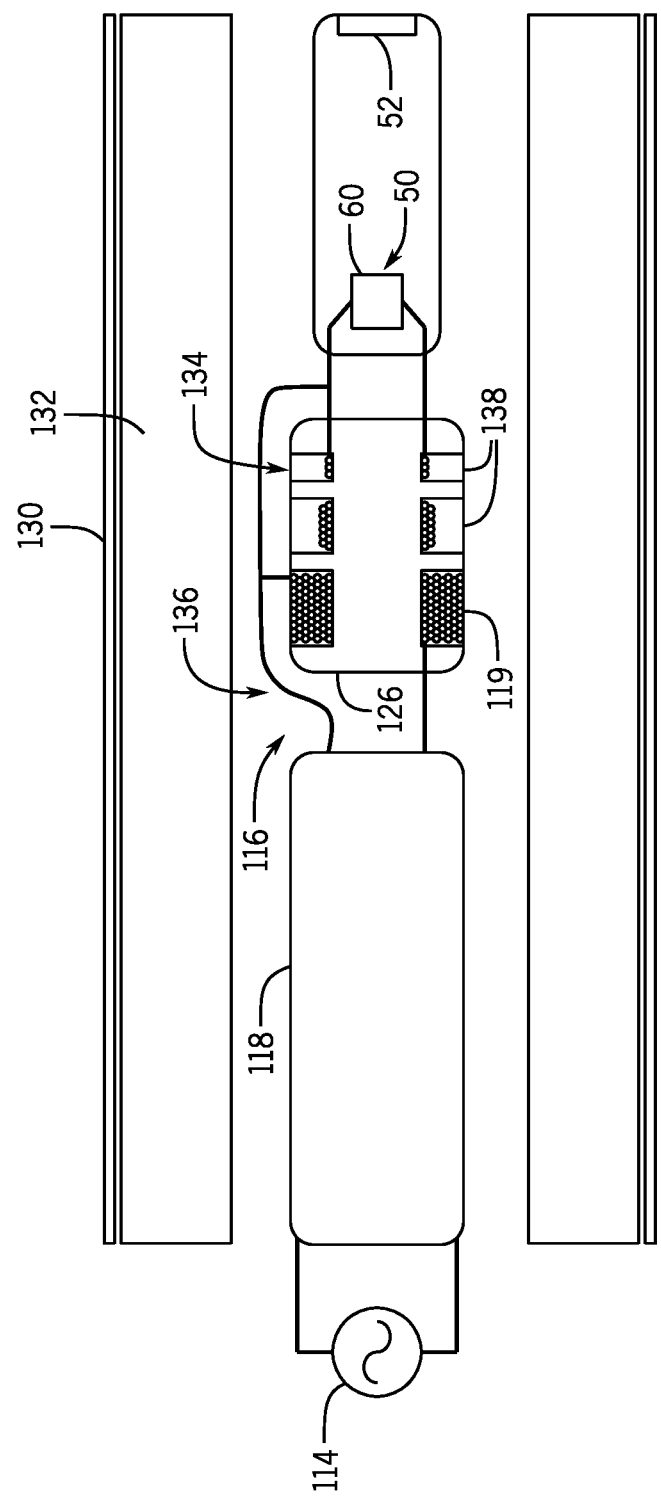
FIG. 9 is a schematic diagram of a downhole tool, in accordance with an embodiment.

As should be appreciated, the high-voltage driver 114, cathode driver 112, voltage multiplier 116, and/or isolation transformer 120 may be disposed within an enclosure 130 of the downhole tool 12, along with one or more insulators 132 and/or the radiation apparatus 38. In an effort to decrease the size of the enclosure 130, in some embodiments, the isolation transformer 120 may be replaced by a step down transformer 134 at the high-voltage end 136 of the voltage multiplier 116, for example as depicted in FIG. 9. As such, the high-voltage driver 114 may provide the power to the heating element 60 instead of a dedicated cathode driver 112, may increase electrical efficiency as well as spatial efficiency.

Additionally, in some embodiments, the boost coil 119 may be utilized as both a boost coil 119 and a step down coil. For example, the boost coil 119 may be wrapped around a magnetic core 126 and one or more additional step down coils 138 may step the voltage level down such that the voltage differential at the heating element 60 is within the operating range of the heating element 60. In some embodiments, the step down transformer 134 may reduce the voltage of the heating element 60 to within the operating range relative to a ground reference, relative to the high-voltage output of the voltage multiplier, or relative to a voltage level in between.

Figure 10:
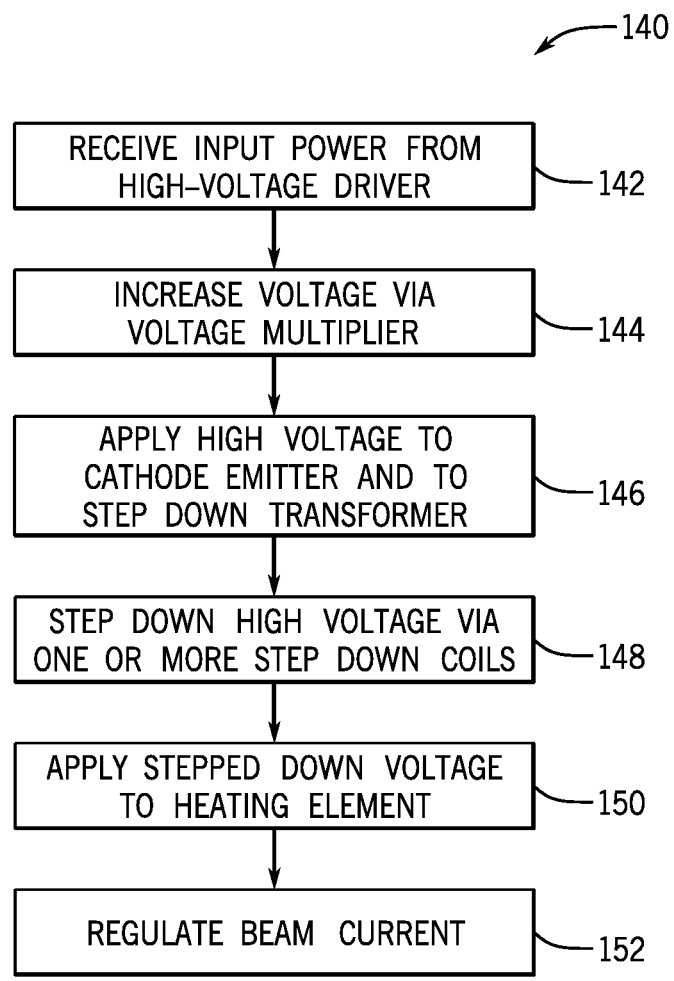
FIG. 10 is a flowchart of an example process for powering a radiation apparatus, in accordance with an embodiment.

FIG. 10 is a flowchart 140 of an example process for powering a radiation apparatus 38. The voltage multiplier 116 may receive an input power from the high-voltage driver 114 (process block 142). The voltage multiplier 116 may then increase the voltage of the input power (process block 144) and apply a high voltage to the cathode emitter 50 and a step down transformer 134 (process block 146). For example, in some embodiments, a boosting coil 119 and the frequency of the input power may be tuned to resonate to generate a large high voltage (e.g., greater than 50 kV, greater than 100 kV, or greater than 400 kV) with a high efficiency (e.g., greater than 70 percent efficient, greater than 80 percent efficient, or greater than 90 percent efficient). One or more step down coils 138 may reduce (e.g., step down) the high voltage (process block 148), and the stepped down voltage may be applied to the heating element 60 (process block 150). Additionally, in some embodiments, the beam current may be regulated (process block 152), for example by the beam injector 44.

As stated above, the step down transformer 134 may eliminate the isolation transformer 120 and the dedicated cathode driver 112, which may assist in reducing the size of the enclosure 130 and/or increasing the available space for insulation 132, which may facilitate increased operating voltages and thus increased radiation output. Additionally, in some embodiments, the step down transformer 134 may have a higher efficiency than the isolation transformer 120 leading to reduced power consumption.

In one embodiment, the isolation transformer 120 and the dedicated cathode driver 112 may also be removed with the use of a cold cathode (e.g., without the use of a heating element 60). In some scenarios, cold cathodes may be difficult to operate with consistent radiation output. For example, a ruggedized, field emission-based cathode may have variations in output due to fluctuations in current from the wearing down of the field emissive layers. However, the self-regulation of the beam injector 44 may provide consistent operation of the cold cathode, and, therefore, facilitate the reduction in size of the enclosure 130 by removing the isolation transformer 120 and the dedicated cathode driver 112. Indeed, in some embodiments, the radiation apparatus housing 48 and/or the voltage multiplier may also be reduced in size to further reduce the size of the downhole tool 12.

In some embodiments, the enclosure 130 may be reduced to less than 5 inches, less than 3 inches, or less than 2 inches in diameter. For example, the housing 48 of the radiation apparatus 38 (e.g., the electron accelerator 46) may be less than 1.5 inches, less than 1.0 inches, or less than 0.8 inches in diameter. Additionally, in some embodiments, voltage multiplier 116 may be reduced to less than 1.5 inches, less than 1.0 inches, or less than 0.8 inches in diameter. For example, the voltage multiplier 116 may include a single layer of capacitors to reduce the diameter.

Additionally, in some embodiments, the insulation 132 may include an insulating gas (e.g., air, sulfur hexafluoride (SF6), etc.), a high dielectric insulator (e.g., perfluoroalkoxy (PFA), fluorinated ethylene propylene (FEP), and/or plastic, Kapton, or Teflon materials), shielding rings (e.g., corona rings), and/or potting material. Shielding rings may be implemented in a co-axial arrangement around the voltage multiplier 116 and/or the radiation apparatus 38 to reduce the electric field stresses proximate the electrical components (e.g., capacitors, diodes, etc.) of the downhole tool 12. In one embodiment, the shielding rings may be generally conductive and made of any suitable metallic material or other conductor. Further, in one embodiment, the shielding rings may be made of a semiconductor plastic. In some embodiments, the multiplier stages of the voltage multiplier 116 may be electrically connected to individual shielding rings spaced axially apart and radially around the electrical components. By maintaining the shielding rings at approximately the same potential as the electrical components within the circumference of the shielding rings, the electric fields and corresponding electric field stresses and, therefore, electrical events within the shielding rings may be reduced. Furthermore, the potting material may have a conductivity greater than $10^{-16}$ S/m and/or a conductivity less than $10^{-4}$ S/m, less than $10^{-8}$ S/m, or less than $10^{-13}$ S/m such as boron nitride with a silicon elastomer (e.g., Sylgard). In some embodiments, the potting material may be more conductive than the dielectric insulator and/or the shielding rings. The potting material may form a cylindrical tube around the electrical components or other suitable shape conforming to the shape of the housing 48 and/or enclosure 130.

Although the present disclosure has generally discussed the beam injector 44 and step down transformer as utilized with the radiation apparatus 38 of the downhole tool 12, the systems and methods of this disclosure may be applied to any charged particle beam-forming electronic device where the size of the enclosure 130 and/or stability of beam optics and/or beam current is of concern.

The specific embodiments described above have been shown by way of example, and it should be understood that these embodiments may be susceptible to various modifications and alternative forms. It should be further understood that the claims are not intended to be limited to the particular forms disclosed, but rather to cover modifications, equivalents, and alternatives falling within the spirit and scope of this disclosure.

The invention claimed is:

1. An apparatus comprising:
 a power supply configured to receive a first voltage potential and output a second voltage potential, wherein the second voltage potential is greater than the first voltage potential;
 a cathode emitter configured to:
  receive the second voltage potential; and
  in response to application of the second voltage potential, emit ions;
 a step down transformer configured to receive the second voltage potential and output a third voltage potential, wherein the third voltage potential is less than the second voltage potential; and
 a heating element configured to:
  receive the third voltage potential; and
  in response to application of the third voltage potential, heat the cathode emitter to lower a work function of the cathode emitter.

2. The apparatus of claim 1, wherein the power supply comprises a voltage multiplier.

3. The apparatus of claim 2, wherein the power supply comprises a boosting coil configured to resonate with the voltage multiplier.

4. The apparatus of claim 3, wherein the step down transformer comprises at least two coils, wherein a first coil of the at least two coils comprises the boosting coil.

5. The apparatus of claim 1, wherein the step down transformer comprises a magnetic core and a plurality of conductive coils.

6. The apparatus of claim 5, wherein at least one coil of the plurality of coils is shared with the power supply.

7. The apparatus of claim 1, wherein the second voltage potential is greater than 50 kilovolts (kV) relative to a ground reference.

8. The apparatus of claim 1, comprising regulator circuitry configured to regulate an ion beam current.

9. The apparatus of claim 8, wherein the regulator circuitry comprises:
 an electrode configured to bias at least a portion of the ions to remain on the cathode emitter; and
 a resistor coupled between the cathode emitter and the electrode and configured to allow self-regulation of a fourth voltage potential on the electrode based at least in part on the ion beam current.

10. The apparatus of claim 9, wherein the electrode is configured to focus the emitted ions into an ion beam.

11. The apparatus of claim 1, wherein the emitted ions are aimed at a target, wherein the target is configured to emit radiation in response to the ions hitting the target.

12. The apparatus of claim 11, wherein the radiation comprises x-ray radiation.

13. The apparatus of claim 1, wherein the heating element is configured to receive the second voltage potential such that the heating element is powered via a voltage difference between the second voltage potential and the third voltage potential.

14. A method comprising:
 receiving a power input at a first voltage potential;
 increasing, via a voltage multiplier, the first voltage potential to a second voltage potential;
 decreasing, via a transformer, the second voltage potential to a third voltage potential;
 providing the second voltage potential to a cathode emitter configured to emit ions; and
 providing the third voltage potential to a heating element of the cathode emitter.

15. The method of claim 14, wherein the transformer comprises a plurality of step down coils disposed around a magnetic core.

16. The method of claim 15, wherein a coil of the plurality of step down coils is configured to resonate with the voltage multiplier to increase the second voltage potential relative to the first voltage potential.

17. The method of claim 14, comprising regulating, via regulator circuitry, an ion beam current of the cathode emitter, wherein the regulator circuitry comprises an electrode configured to bias at least a portion of the ions to remain on the cathode emitter.

* * * * *